US010230288B2

(12) United States Patent
Tramet et al.

(10) Patent No.: US 10,230,288 B2
(45) Date of Patent: Mar. 12, 2019

(54) ELECTRICAL DEVICE AND METHOD OF ASSEMBLING SUCH AN ELECTRICAL DEVICE

(71) Applicant: Valeo Systemes de Controle Moteur, Cergy-Pontoise (FR)

(72) Inventors: Guillaume Tramet, Montesson (FR); Arnaud Mas, Cergy (FR); Ernesto Sacco, Cergy (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 0 days.

(21) Appl. No.: 15/364,331

(22) Filed: Nov. 30, 2016

(65) Prior Publication Data

US 2017/0163129 A1 Jun. 8, 2017

(30) Foreign Application Priority Data

Dec. 2, 2015 (FR) ...................................... 15 61738

(51) Int. Cl.
*H05K 1/11* (2006.01)
*H02K 11/33* (2016.01)
(Continued)

(52) U.S. Cl.
CPC ............. *H02K 11/33* (2016.01); *H02K 5/225* (2013.01); *H02K 15/14* (2013.01); *H05K 5/064* (2013.01);
(Continued)

(58) Field of Classification Search
CPC ... H05K 1/00; H05K 1/02; H05K 1/11; H05K 1/14; H05K 1/18; H05K 3/00; H05K 3/30;
(Continued)

(56) References Cited

U.S. PATENT DOCUMENTS 5,657,203 A * 8/1997 Hirao .................. H01L 21/4842
257/E23.066
6,028,770 A * 2/2000 Kerner ................ B60R 16/0239
165/80.2
(Continued)

FOREIGN PATENT DOCUMENTS

DE 102007062918 A1 6/2009
WO 2015033062 A2 3/2015

OTHER PUBLICATIONS

Preliminary Search Report issued in corresponding French Patent Application No. 1561738, dated Aug. 8, 2016 (2 pages).

*Primary Examiner* — Xiaoliang Chen
(74) *Attorney, Agent, or Firm* — Osha Liang LLP

(57) ABSTRACT

The invention relates to an electrical device (10), notably intended to control an electric machine, comprising:
  a first zone filled with an insulating material (A) and comprising a first electronic unit (12) embedded in the insulating material (A);
  a second zone filled with an insulating material (B) and comprising a second electronic unit (18) embedded in the insulating material (B); and
  a third zone filled with an insulating material (B) and comprising at least one electrical connection element (22) embedded in the insulating material (B), the at least one electrical connection element (22) connecting the first electronic unit (12) with the second electronic unit (18);
in which the first and the second zone are each in contact with the third zone so that the electrical device comprises at least one space extending around the third zone and between the first and the second zone.

13 Claims, 3 Drawing Sheets

Figure 1:
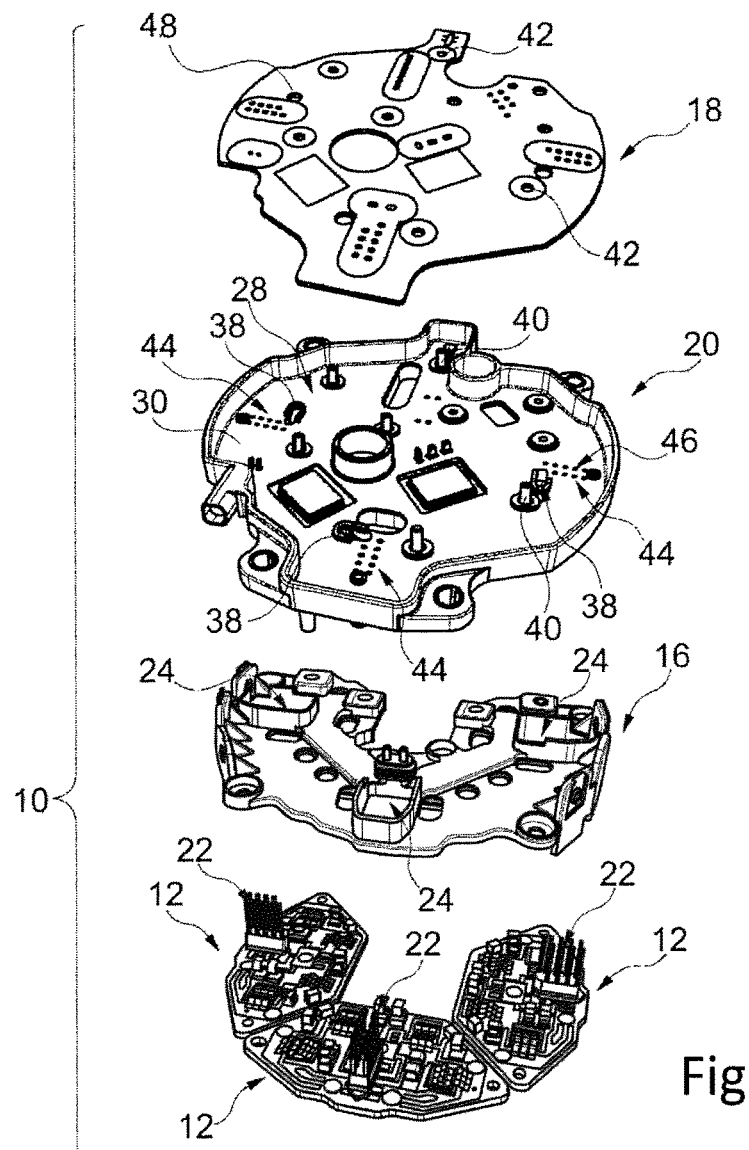
Figure 1:
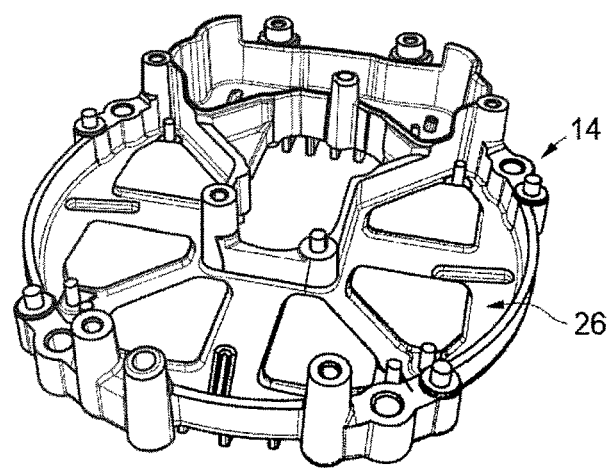

(51) Int. Cl.
*H02K 5/22* (2006.01)
*H02K 15/14* (2006.01)
*H05K 7/14* (2006.01)
*H05K 7/20* (2006.01)
*H05K 5/06* (2006.01)
*H05K 1/14* (2006.01)
*H05K 3/28* (2006.01)

(52) U.S. Cl.
CPC ............. *H05K 5/069* (2013.01); *H05K 7/14* (2013.01); *H05K 7/1432* (2013.01); *H05K 7/209* (2013.01); *H05K 1/144* (2013.01); *H05K 3/28* (2013.01); *H05K 2201/10189* (2013.01); *H05K 2203/1327* (2013.01)

(58) Field of Classification Search
CPC .. H05K 3/36; H05K 3/46; H05K 7/00; H05K 7/02; H05K 7/06; H05K 7/20; H01L 21/02; H01L 21/48; H01L 21/56; H01L 21/67; H01L 21/70; H01L 23/02; H01L 23/28; H01L 23/31; H01L 23/48; H01L 23/52; H01L 23/58
USPC ....... 174/252, 258, 266, 387, 390, 541, 548; 361/690, 695, 700, 704, 707, 728, 761, 361/792, 796; 439/69, 76.2, 701; 29/830, 841
See application file for complete search history.

(56) References Cited

U.S. PATENT DOCUMENTS

| | | | | |
|---|---|---|---|---|
| 6,152,758 A * | 11/2000 | Matsuoka | ............ | H01R 13/6215 439/247 |
| 6,313,598 B1 * | 11/2001 | Tamba | ................ | H01L 23/3107 257/692 |
| 6,560,115 B1 * | 5/2003 | Wakabayashi | ....... | H05K 5/0065 174/541 |
| 6,690,582 B2 * | 2/2004 | Sumida | ............... | B60R 16/0238 361/735 |
| 6,704,202 B1 * | 3/2004 | Hamaoka | ............. | F25D 23/006 361/690 |
| 6,922,332 B2 * | 7/2005 | Naimi | ................ | B60R 16/0238 361/641 |
| 6,985,363 B2 * | 1/2006 | Yagi | ....................... | G06K 19/07 361/760 |
| 7,594,830 B2 * | 9/2009 | Murakami | ............ | H01R 4/185 439/701 |
| 7,727,022 B2 * | 6/2010 | Polehonki | ........... | B60R 16/0238 439/620.27 |
| 8,027,168 B2 * | 9/2011 | Senk | .................. | B60R 16/0238 174/387 |
| 8,876,537 B2 * | 11/2014 | Katsuse | ............... | H01R 13/506 439/701 |
| 8,961,197 B2 * | 2/2015 | Ferran Palau | ......... | H01R 33/06 439/76.2 |
| 9,017,082 B2 * | 4/2015 | Makino | ................. | H02G 3/088 439/76.2 |
| 9,635,762 B2 * | 4/2017 | Watanabe | ............. | H01L 25/105 |
| 9,674,970 B2 * | 6/2017 | Yamamoto | ........... | H05K 3/4697 |
| 2001/0053068 A1 * | 12/2001 | Murayama | ............. | H05K 1/144 361/760 |
| 2003/0060172 A1 * | 3/2003 | Kuriyama | ............. | H04B 1/036 455/575.1 |
| 2004/0056344 A1 * | 3/2004 | Ogawa | ................ | H01L 21/6835 257/686 |
| 2005/0029642 A1 * | 2/2005 | Takaya | ................ | H01L 23/5389 257/678 |
| 2005/0199993 A1 * | 9/2005 | Lee | ...................... | H01L 23/3157 257/686 |
| 2006/0220189 A1 * | 10/2006 | Sakamoto | ............ | G01D 11/245 257/666 |
| 2006/0231939 A1 * | 10/2006 | Kawabata | ............ | H01L 23/5385 257/686 |
| 2006/0261472 A1 * | 11/2006 | Kimura | ................... | H01L 24/97 257/724 |
| 2007/0093090 A1 * | 4/2007 | Fujimaki | .............. | H01H 50/043 439/76.2 |
| 2007/0161266 A1 * | 7/2007 | Nishizawa | .............. | H01L 24/97 439/69 |
| 2008/0081161 A1 * | 4/2008 | Tomita | .................. | H01L 23/145 428/209 |
| 2008/0144048 A1 * | 6/2008 | Ikebe | .................... | H01L 23/544 356/626 |
| 2008/0155820 A1 * | 7/2008 | Arai | ...................... | H01L 21/565 29/830 |
| 2008/0165513 A1 * | 7/2008 | Inoue | .................. | H01L 23/3128 361/761 |
| 2008/0174978 A1 * | 7/2008 | Inoue | .................. | H01L 21/4857 361/784 |
| 2009/0086431 A1 * | 4/2009 | Sakamoto | .......... | H05K 7/20009 361/695 |
| 2009/0086454 A1 * | 4/2009 | Sakamoto | .............. | H05K 1/144 361/796 |
| 2009/0086455 A1 * | 4/2009 | Sakamoto | .............. | H05K 1/144 361/796 |
| 2009/0103276 A1 * | 4/2009 | Sakamoto | ............. | H05K 1/144 361/792 |
| 2009/0146314 A1 * | 6/2009 | Akaike | ............... | H01L 25/0652 257/777 |
| 2009/0152693 A1 * | 6/2009 | Sato | .................... | H01L 25/0657 257/668 |
| 2010/0051337 A1 * | 3/2010 | Nakamura | ............. | H05K 1/141 174/258 |
| 2013/0258594 A1 * | 10/2013 | Gradinger | ............. | F28D 15/02 361/700 |
| 2014/0070428 A1 * | 3/2014 | Tanimoto | ................ | H01L 21/78 257/777 |
| 2015/0092376 A1 * | 4/2015 | Arens | ..................... | H01L 21/56 361/767 |

* cited by examiner

ELECTRICAL DEVICE AND METHOD OF ASSEMBLING SUCH AN ELECTRICAL DEVICE

The subject of the invention is an electrical device intended to control an electric machine and a method of assembling such an electrical device.

Usually, an electrical device intended to control an electric machine, such as a voltage converter, comprises electronic units which require efficient insulation to dust, to liquids, to gases or else to moisture. Accordingly, insulation with the aid of a deposition of insulating material can be carried out.

However, in general, the insulation of an electrical device requires a significant quantity of insulating material in order to guarantee efficient insulation of the electrical device. Therefore, these electrical devices have high production costs.

The present invention is aimed at remedying these drawbacks by proposing an electrical device making it possible to reduce the quantity of insulating material required in order to insulate the electrical device, while guaranteeing efficient insulation of the said electrical device.

For this purpose, the subject of the invention is an electrical device, notably intended to control an electric machine, comprising:
  a first zone filled with an insulating material and comprising a first electronic unit, notably an electronic power unit, embedded in the insulating material;
  a second zone filled with an insulating material and comprising a second electronic unit, notably an electronic control unit, embedded in the insulating material; and
  a third zone filled with an insulating material and comprising at least one electrical connection element embedded in the insulating material, the at least one electrical connection element connecting the first electronic unit with the second electronic unit;
  in which the first and the second zone are each in contact with the third zone so that the electrical device comprises at least one space extending around the third zone and between the first and the second zone.

In particular, the space is free of substance, notably devoid of insulating material.

In particular, the power electronics is intended to deliver an electric current to an electric machine with the help of a voltage source.

Advantageously, in the electrical device according to the invention, the space between the first and the second zone makes it possible to decrease the production costs of such an electrical device, by virtue of a reduction in the quantity of insulating material required to efficiently insulate the electronic control and power units. Furthermore, this space allows circulation of air between the first and the second zone and around the third zone, and thus better cooling of the electrical device by convection.

The electrical device according to the invention can also comprise one or more of the following characteristics, considered individually or according to all the possible combinations:
  the first, second and third zones are superposed, the first and second zones extending substantially along parallel planes;
  the third zone is defined at least in part by a hollow column into which the at least one electrical connection element is intended to be inserted, the hollow column extending between the first and the second zone;
  the hollow column is filled with insulating material;
  the electrical device according to the invention also comprises a support of an electronic unit, arranged between the first electronic unit and the second electronic unit and comprising an open cavity intended to receive the second electronic unit;
  the hollow column extends from the open cavity, and is configured to communicate with the open cavity at a first end of the hollow column;
  a second end of the hollow column opposite to the first end is in contact with the insulating material in which the first electronic unit is embedded;
  the bottom of the open cavity comprises guidance elements for guiding the at least one electrical connection element and intended to guide the at least one electrical connection element towards the second electronic unit, the guidance elements being notably arranged at the first end of the hollow column;
  the electrical device according to the invention also comprises an electrical connector configured to electrically connect the first electronic unit to at least one of the electrical elements (phase φ, $B^+$, $B^-$) of an electric machine controlled by the electrical device and/or of an electrical energy source, and comprised at least in part in the said space extending around the third zone and between the first and the second zone;
  the electrical connector is arranged between the first electronic unit and the support of the second electronic unit, the electrical connector comprising an orifice into which the hollow column is intended to be inserted.

The invention also pertains to a method of assembling an electrical device, notably intended to control an electric machine, comprising:
  a step in which a first electronic unit, notably an electronic power unit, embedded in an insulating material forming a first zone, a second electronic unit, notably an electronic control unit, and at least one electrical connection element an end of which is connected to the said first electronic unit are provided;
  a step of connecting the at least one electrical connection element, in which an end opposite to the end connected to the said first electronic unit is connected to the second electronic unit; and
  a step of depositing an insulating material, in which the second electronic unit is embedded in an insulating material forming a second zone and the at least one electrical connection element is embedded in an insulating material forming a third zone so that the first and the second zone are each in contact with the third zone and that the electrical device comprises at least one space extending around the third zone and between the first and the second zone.

Stated otherwise, a straight line passing through the first zone, the said space and the second zone, comprises a part included in the first zone, a part included in the said space and a part included in the second zone, the said parts being contiguous.

In particular, the space is free of substance, notably devoid of insulating material.

In particular, the power electronics is intended to deliver an electric current to an electric machine with the help of a voltage source. For example, the electric machine is a starter, a starter-alternator or another electric machine onboard the vehicle.

Advantageously, the method of assembling the electrical device allows efficient insulation of the electronic units, while guaranteeing a reduction in production costs, notably by virtue of a reduction in the quantity of material required for the insulation of the electrical device. Furthermore, the space extending around the third zone and between the first and the second zone allows circulation of air between the first and the second zone and around the third zone, and thus better cooling of the electrical device by convection.

The method of assembling an electrical device according to the invention can also comprise one or more of the following characteristics, considered individually or according to all the possible combinations:

- the method of assembling an electrical device according to the invention furthermore comprises, before the step of connecting the at least one electrical connection element:
  - a step in which a support of an electronic unit is provided, the support of the electronic unit being arranged between the first electronic unit and the second electronic unit, and comprising an open cavity intended to receive the second electronic unit, and a hollow column extending from the open cavity, and communicating with the open cavity at a first end of the hollow column;
  - a step of inserting the at least one electrical connection element into the hollow column, in which the at least one electrical connection element is inserted into the hollow column with a view to its connection with the second electronic unit, so that a second and of the hollow column opposite to the first end is in contact with the insulating material in which the first electronic unit is embedded;
- the method of assembling an electrical device according to the invention comprises a step of guiding the at least one electrical connection element, in which the at least one electrical connection element is guided towards the second electronic unit with a view to its connection with the second electronic unit by guidance elements arranged at the first end of the hollow column;
- the step of depositing insulating material comprises a step of filing the hollow column, in which the hollow column is filled with insulating material before embedding the second electronic unit in the insulating material.

Figure 2:
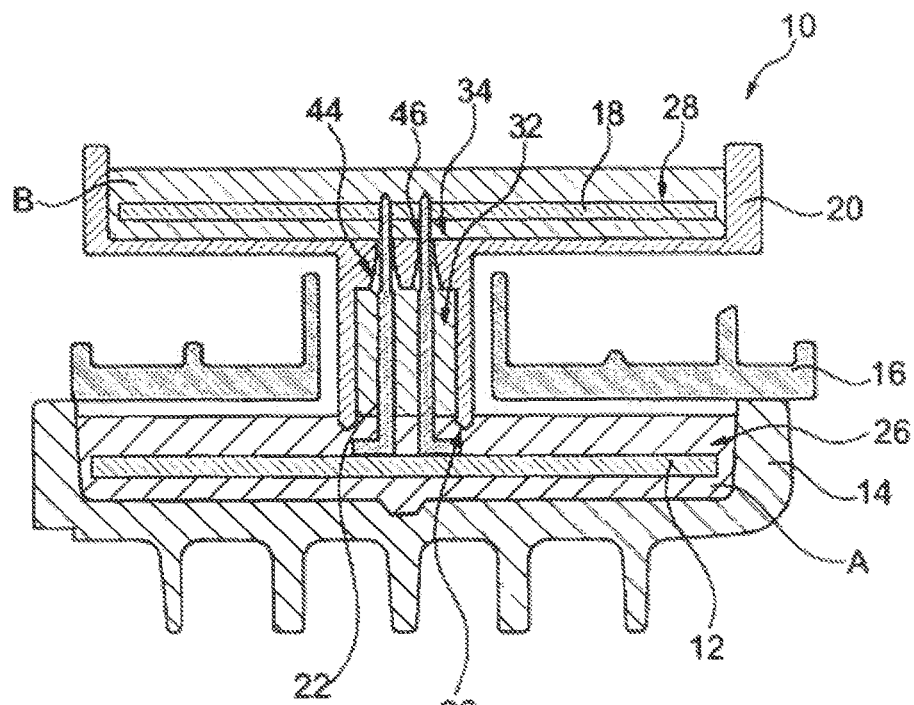
Figure 3:
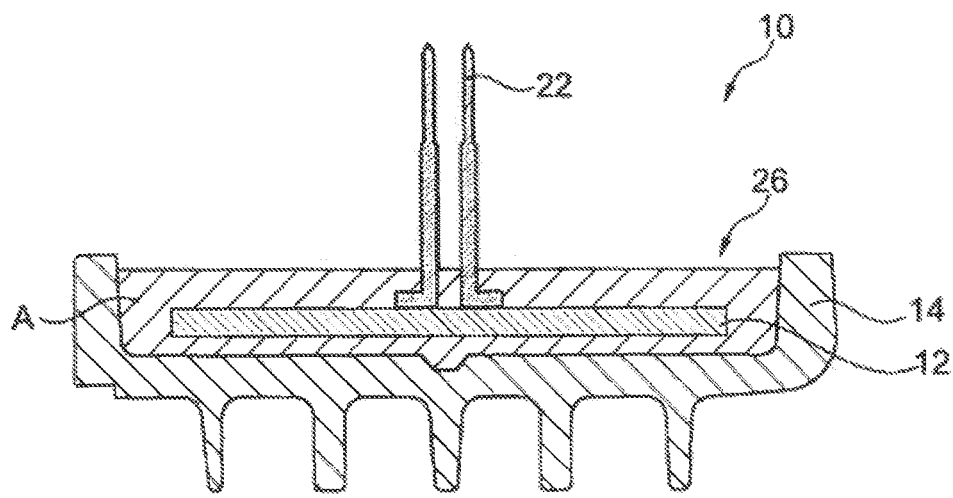
Figure 4:
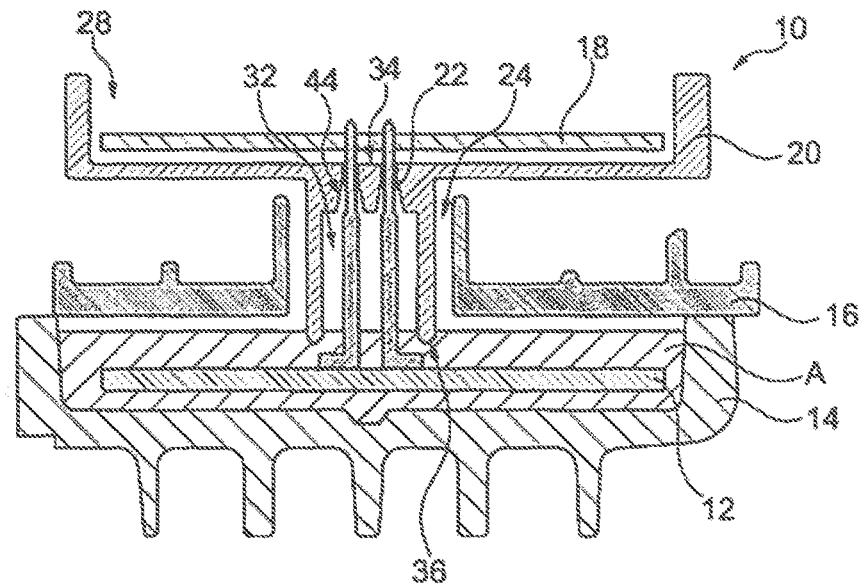
Figure 5:
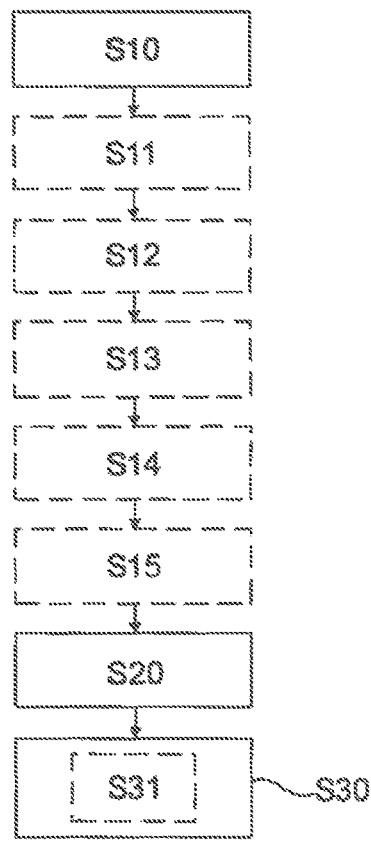

Other characteristics and advantages of the present invention will become apparent on reading the description and the following figures:

FIG. 1 is an exploded view according to a preferred embodiment of an electrical device according to the invention, FIG. 2 represents a sectional view of an electrical device according to the preferred embodiment of FIG. 1, FIGS. 3 and 4 represent a sectional view of the electrical device of FIG. 1 at various steps of the method of assembling the said electrical device, and FIG. 5 is a flowchart of the steps of the method of assembling the electrical device according to a preferred embodiment of the invention.

It should be noted that these drawings have no other aim than to illustrate the text of the description and do not in any way constitute a limitation of the scope of the invention.

In the various figures, analogous elements are designated by identical references.

The electrical device according to the invention is for example intended to control an electric machine, notably an electric machine intended to be integrated into an automotive vehicle, such as a rotating electric machine.

The electrical device comprises at least one first electronic unit, for example an electronic power unit, at least one second electronic unit, for example an electronic control unit, and at least one electrical connection element intended to electrically connect the said electronic units.

The electrical device is for example a voltage converter such as illustrated in the figures. Of course, the invention is in no way limited to a voltage converter, but on the contrary the electrical device could be any other electrical device intended to control an electric machine.

Likewise, the first electronic unit will be illustrated by an electronic power unit, such as one or more electronic power modules and the second electronic unit will be illustrated by an electronic control unit, such as an electronic control board. Of course, the electronic units could be respectively any other electronic component.

In particular, FIG. 1 represents an exploded view of a voltage converter 10 comprising electronic power modules 12, in this example three in number, a support 14 of the electronic modules, an electrical connector 16, an electronic control board 18, and an electronic board support 20.

Advantageously, the voltage converter 10 is an AC/DC converter. Preferably, the voltage converter 10 is integrated into the casing of the electric machine.

The electronic control board 18 is notably intended to control the electronic power modules 12. In particular, the electronic board 18 is intended to be connected electrically with the electronic power modules 12 via at least one electrical connection element 22.

The electrical connector 16 is arranged between the electronic power modules 12 and the support 20 of the electronic board. The electrical connector 16 is configured to electrically connect the electronic modules 12 to at least one of the electrical elements (phase $\varphi$), of the electric machine and/or to at least one of the electrical elements ($B^+$, $B^-$) of an electrical energy source. The electrical elements of the electric machine are, for example, phases $\varphi$. The electrical elements of the electrical energy source are for example a positive DC terminal $B^+$, a negative DC terminal $B^-$ or the earth. There is preferably an electronic power module 12 per phase $\varphi$. Furthermore, as represented in FIG. 1, the electrical connector 16 comprises orifices 24 designed to permit access of the electrical connection elements 22 of the electronic modules 12 with the electronic control board 18.

The support 14 of the electronic power unit is advantageously a box comprising at least one open cavity 26 having a bottom on which the electronic power modules 12 are mounted. Advantageously, the box allows thermal and electrical conduction, notably for earth pickup and thermal diffusion. The open cavity 26 is intended to be filled with an insulating material so that the electronic power modules 12 are embedded in the insulating material. In particular, this configuration allows efficient insulation of the electronic modules 12. Advantageously, the power module support 14 is a heat dissipator, also called a thermal dissipator. The power modules 12 are fixed to the thermal dissipator so as to allow thermal transfer between the power modules 12 and a cooling circuit (not represented), so as to dissipate the heat generated by the electronic modules 12. Furthermore, the open cavity 26 for receiving the electronic modules can comprise positioning elements (not represented) intended to position the electronic modules 12 on the support 14 in a predetermined position. These positioning elements make it possible to facilitate and guarantee correct and fast positioning of the electronic 15S modules 12 on the support 14 with a view to their electrical connection with the electronic board 18.

The support 20 of the electronic control board is arranged between the electronic power modules 12 and the electronic control board 18. The support 20 of the electronic control board is preferably made of insulating substance, for example moulded from plastic.

The support 20 comprises an open cavity 28 having a bottom 30 on which the electronic board 18 is intended to be received.

The support 20 also comprises at least one hollow column 32 into which the at least one electrical connection element 22 of the electronic board 18 with the electronic modules 12 is intended to be inserted. The hollow column 32, notably visible in FIG. 2, extends from the open cavity 28 and is configured to communicate with the open cavity 28 at a first end 34 of the hollow column 32. In particular, in FIG. 1, the support 20 of the electronic board 18 comprises three hollow columns, each hollow column being intended to receive the electrical connection elements 22 for connecting each electronic module 12 with the electronic control board 18. The open cavity 28 is intended to be filled with an insulating material so that the electronic control board 18 is embedded in the insulating material. The electronic control board 18 is thus insulated in an efficient manner.

Advantageously, the electronic control board support 20 can comprise a filing element 38 for the hollow column 32. The filling element 38, also called a filling channel, can have a general ramp shape, preferentially a helical shape. An end of the filling element 38 communicates with the bottom 30 of the open cavity 28 and another end of the filling element 38 communicates with a lateral wall of the hollow column 32. Preferably, a second end 36 of the hollow column 32 is in contact with the insulating material in which the electronic module 12 is embedded. This configuration makes it possible to guarantee the filing of the hollow column 32 with insulating material, and thus to ensure efficient insulation of the electrical connection elements 22.

The electronic control board 18 can advantageously comprise an orifice 48 arranged opposite the end of the channel 38 communicating with the bottom 30 of the open cavity 28. The orifice 48 of the electronic board 18 allows notably the filing of the hollow column 32 with insulating material B by way of the channel 38.

Furthermore, the bottom 30 of the open cavity 28 preferably comprises positioning elements 40 intended to position the electronic board 18 on the support 20 in a predetermined position. Stated otherwise, the positioning elements 40 disposed on the support 20 of the electronic board are intended to cooperate with complementary positioning elements 42 of the electronic board 18. For example, in FIG. 1, six positioning elements 40 are represented, each comprising a lug protruding from the bottom 30 of the open cavity 28, in a manner perpendicular to the bottom 30. The positioning elements 40 can be of cylindrical shape as represented in FIG. 1. The six complementary positioning elements 42 of the electronic board are positioning orifices preferably exhibiting a cross section whose shape and dimensions are complementary to the shape and dimensions of the positioning elements 40. For example, as illustrated in FIG. 1, the complementary positioning elements 42 exhibit a circular cross section. These positioning elements 40 make it possible to position the electronic board 18 correctly and rapidly on the support 20, and thus to allow efficient electrical connection of the electronic board 18 with the electronic power modules 12.

Moreover, the bottom 30 of the open cavity 28 advantageously comprises guidance elements 44 for guiding the at least one electrical connection element 22 arranged at the first end 34 of the hollow column 32 and intended to guide the at least one electrical connection element 22 towards the electronic board 18. For example, in FIG. 1, the bottom 30 of the open cavity 28 comprises three groups of guidance elements 44. The guidance elements 44 comprise guidance orifices 46, advantageously a guidance orifice 46 per electrical connection element 22. The guidance orifices 46 make it possible to recentre the electrical connection elements 22 with a view to the electrical connection of the electronic module 12 with the electronic board 18 and thus to correctly connect the electronic module 12 with the electronic board 18. Preferably, in order to allow better recentring of the electrical connection elements 22, the cross-section of the guidance orifices 46 facing the electronic module 12 is larger than the cross-section of the guidance orifices 46 facing the electronic board 18. For example, in FIG. 2, the two guidance elements 44 exhibit a circular cross-section and comprise a frustoconical portion followed by a cylindrical portion.

Moreover, the electrical device 10 is intended to receive insulating materials A, B allowing insulation of the electronic power unit 12, of the electronic control unit 18 and of the electrical connection elements 22. The insulating materials A, B allow insulation to dust, to liquids, to gases or else to moisture.

For example, the insulating material can be a resin, such as an epoxy resin, or an insulating gel, such as a silicone gel.

The electronic units 12, 18 of the electrical device 10 can be insulated with identical or different insulating materials A, B. Preferably the electronic control and power units are insulated with an identical insulating material, notably with an insulating gel.

More precisely, the electrical device comprises:
- a first zone filled with an insulating material A and comprising an electronic power unit 12 embedded in the insulating material;
- a second zone filled with an insulating material B and comprising an electronic control unit 18 embedded in the insulating material B; and
- a third zone filled with an insulating material B and comprising at least one electrical connection element 22 embedded in the insulating material B.

The first and the second zone are each in contact with the third zone so that the electrical device 10 comprises at least one space extending around the third zone and between the first and the second zone.

More precisely, as represented in FIG. 2, the open cavity 26 of the support 14 of the electronic power modules is filled with a layer of insulating material A so as to define the first zone. The open cavity 28 of the support 20 of the electronic board 18 is filled with a layer of insulating material B so as to define the second zone. The hollow column 32 is filled, notably predominantly filled, with insulating material B so as to define the third zone. The interface between the insulating materials A and B is notably situated inside the hollow column 32, in proximity to the second end 36 of the hollow column 32. Here, the insulating materials A and B are the same insulating gels.

Stated otherwise, the insulating material A, B fills the free interior space of each open cavity 26, 28 around the components of the electronic board 18 and/or of the electronic power modules 12. The insulating material A, B allows leaktightness of the electronic board 18 and of the electronic power modules 12, notably leaktightness to dust and to liquids. The insulating material thus makes it possible to eliminate any risk of possible short-circuiting at the level of the electronic board 18 or of the power modules 12.

Moreover, as represented in FIG. 2, the second end 36 of the hollow column 32 opposite to the first end 34 is in contact with the insulating material A in which the electronic power module 12 is embedded so that the electrical connection elements 22 are embedded in the insulating materials A, B. This configuration makes it possible to eliminate any risk of possible short-circuiting at the level of the interconnection of the electronic board 18 with the power modules 12.

Furthermore, the space lying between the electronic board 18 and the power module 12 and surrounding the hollow column 32 is devoid of substance, notably of insulating material. The space free of substance, notably of insulating material, between the first and the second zone has, inter alia, the effect of leaving a space free for air circulation, thus allowing cooling by convection. Moreover, this configuration makes it possible to decrease the production costs of the electrical device 10, by virtue notably of a saving in insulating material.

Moreover, the invention also relates to a method of assembling such an electrical device according to the invention. Various steps of the assembling method are illustrated in FIGS. 3 to 5 and will be described in greater detail in the subsequent description.

With regard to FIG. 5, the method of assembling the electrical device comprises a step S10 in which an electronic control unit 18, an electronic power unit 12 embedded in an insulating material A forming a first zone and at least one electrical connection element 22 an end of which is connected to the said electronic power unit 12 are provided.

For example and preferably, the method of assembling the electrical device comprises a step S11 in which a support 14 of the electronic power unit, here an electronic power module 12, is provided. As represented in FIG. 3, the open cavity 26 of the support 14 is intended to receive an electronic power module 12 and to be filled with insulating material A, so that the electronic power unit 12 is embedded in the insulating material A.

Advantageously, the method of assembling the electrical device can comprise a step S12 in which an electrical connector 16 is provided. The arrangement of the electrical connector 16 in relation to an electronic module 12 and to the electronic module support 14 is for example visible in FIG. 4. The electrical connector 16 is comprised at least in part in the space extending around the third zone and between the first and the second zone. The electrical connector 16 comprises an orifice 24 designed to permit access of the electrical connection elements 22 of the electronic modules 12 with the electronic control board 18.

According to a preferred embodiment illustrated in FIG. 5, the method of assembling the electrical device preferably comprises a step S13 in which a support 20, such as previously described, of the electronic control unit 18 is provided. The support 20 of the electronic control unit is then arranged between the electronic power unit 12 and the electronic control unit 18. As represented in FIG. 4, the electronic board support 20 is fixed in the electronic modules support 14 so as to be opposite the electronic power modules 12. The support 20 preferably comprises an open cavity 28 intended to receive the electronic control unit 18 and a hollow column 32 such as were described previously.

Thus, the first, second and third zones are superposed, the first and second zones extending substantially along parallel planes.

Subsequent to step S13, the assembling method can comprise a step S14 of inserting the at least one electrical connection element 22 into the hollow column 32. As represented in FIG. 4, the electrical connection elements 22 are then inserted into the hollow column 32 with a view to their connection with the electronic control unit 18. The second end 36 of the hollow column 32 opposite to the first end 34 is in contact with the insulating material A in which the electronic power unit 12 is embedded. This configuration makes it possible to eliminate any risk of possible short-circuiting at the level of the interconnection of the electronic board 18 with the power modules 12, the hollow column 32 being intended to be filled with insulating material B.

Advantageously, the method of assembling the electrical device can comprise a step S15 of guiding the at least one electrical connection element 22. The electronic board support 20 comprises guidance elements 44 for guiding the electrical connection elements 22 such as represented in FIG. 4. The electrical connection elements are guided towards the electronic control unit 18 by the guidance elements 44 arranged at the first end 34 of the hollow column 32.

The method of assembling the electrical device according to the invention furthermore comprises a step S20 of connecting the at least one electrical connection element 22. As represented in FIG. 4, an end of the electrical connection elements 22 is connected to the electronic module 12 and the end opposite to the end connected to the said electronic power module 12 is connected to the electronic control board 18.

Subsequent to step S20, the method of assembling the electrical device according to the invention comprises a step S30 of depositing an insulating material. As illustrated in FIG. 2, the electronic module 12 is embedded in a layer of insulating material A while the electronic board 18 and the electrical connection elements 22 are embedded in a layer of insulating material B. A zone devoid of insulating material is visible, around the electrical connection elements 22 and between the support 20 of the electronic control board and the insulating material A covering the electronic power module 12. This zone devoid of insulating material allows efficient cooling of the electronic modules, while guaranteeing insulation at the level of the electrical connection elements 22.

Moreover, step S30 can comprise a step S31 of filling the hollow column 32, in which the hollow column 32 is filled with insulating material B before embedding the electronic control unit 18 in the insulating material B. The deposition of insulating material B inside the hollow column 32 is performed by the filing element 38 for the electronic board support 20. The filling of the hollow column 32 by the filling element 38 makes it possible to fill the hollow column 32 entirely. This allows better insulation of the electrical connection elements 22 and makes it possible to avoid possible risks of short-circuiting at the level of the interconnection of the electronic module 12 with the electronic board 18.

As illustrated in FIG. 8, according to a preferred embodiment of the invention, steps S11 to S15 can be carried out consecutively and in combination before step S20. Of course, this embodiment is not limiting, steps S11 to S15 may or may not be carried out consecutively, alone or according to any possible combination.

The electrical device intended to control an electric machine has been described within the framework of a voltage converter intended to supply an electric machine notably intended to supply an automotive vehicle. Of course, the invention is in no way limited to the embodiment described and illustrated, which has been given merely by way of example. On the contrary, other applications of the electrical device in accordance with the invention are also possible without departing from the scope of the invention.

The invention claimed is:

1. An electrical device for controlling an electric machine, comprising:
   a first zone filled with a first insulating material and comprising a first electronic unit embedded in the first insulating material;
   a second zone filled with a second insulating material and comprising a second electronic unit embedded in the second insulating material;
   a third zone filled with the second insulating material; and
   an electrical connection element,
   wherein the electrical connection element is embedded in its entirety by a combination of the first insulating material and the second insulating material,
   wherein the electrical connection element connects the first electronic unit with the second electronic unit,
   wherein the first zone and the second zone are each in contact with the third zone so that the electrical device comprises at least one space extending around the third zone and between the first zone and the second zone.

2. The electrical device according to claim 1, in which the first, second and third zones are superposed, the first and second zones extending substantially along parallel planes.

3. The electrical device according to claim 1, in which the third zone is defined at least in part by a hollow column into which the at least one electrical connection element is intended to be inserted, the hollow column extending between the first and the second zone.

4. The electrical device according to claim 3, in which the hollow column is filled with the second insulating material.

5. The electrical device according to claim 3, also comprising a support of an electronic unit, arranged between the first electronic unit and the second electronic unit and comprising an open cavity intended to receive the second electronic unit.

6. The electrical device according to claim 5, in which the hollow column extends from the open cavity and is configured to communicate with the open cavity at a first end of the hollow column.

7. The electrical device according to claim 6, in which a second end of the hollow column opposite to the first end is in contact with the first insulating material in which the first electronic unit is embedded.

8. The electrical device according to claim 5, in which the bottom of the open cavity comprises guidance elements for guiding the at least one electrical connection element and intended to guide the at least one electrical connection element towards the second electronic unit.

9. The electrical device according to claim 5, further comprising;
   an electrical connector configured to electrically connect the first electronic unit to at least one of the electrical elements of an electric machine controlled by the electrical device and/or of an electrical energy source, and comprised at least in part in the space extending around the third zone and between the first and the second zone.

10. The electrical device according to claim 9, in which the electrical connector is arranged between the first electronic unit and the support of the second electronic unit, the electrical connector comprising an orifice into which the hollow column is intended to be inserted.

11. The electrical device according to claim 1, further comprising:
    a first protective support; and
    a second protective support,
    wherein the first zone is covered by the first protective support;
    wherein the second zone and the third zone are covered by the second protective support;
    wherein the first protective support and the second protective support are distinct from each other.

12. The electrical device according to claim 1, wherein:
    the third zone is positioned immediately on top of the first zone,
    the second zone is positioned immediately on top the third zone,
    the first zone, second zone, and third zone are positioned in a vertical structure defined by a first protective support and a second protective support.

13. An electrical device for controlling an electric machine, comprising:
    a first zone filled with a first insulating material;
    a first circuit board comprising a first plurality of electronic elements,
       wherein the first zone comprises the first circuit board completely surrounded by the first insulating material;
    a second zone filled with a second insulating material;
    a second circuit board comprising a second plurality of electronic elements,
       wherein the second zone comprises the second circuit board completely surrounded by the second insulating material;
    a third zone filled with the second insulating material; and
    an electrical connection element,
    wherein the electrical connection element connects the first circuit board with the second circuit board, and
    wherein the first zone and the second zone are each in contact with the third zone so that the electrical device comprises at least one space extending around the third zone and between the first zone and the second zone.

* * * * *